United States Patent [19]

Ibe et al.

[11] Patent Number: 4,644,300
[45] Date of Patent: Feb. 17, 1987

[54] VOLTAGE-CONTROLLED VARIABLE-FREQUENCY PULSE OSCILLATOR

[75] Inventors: Hiroyuki Ibe, Yokohama; Taro Shibagaki, Tokyo, both of Japan

[73] Assignee: Kabushiki Kaisha Toshiba, Kawasaki, Japan

[21] Appl. No.: 685,165

[22] Filed: Dec. 21, 1984

[30] Foreign Application Priority Data

Dec. 26, 1983 [JP] Japan ................. 58-243724

[51] Int. Cl.$^4$ .............................. H03K 3/26
[52] U.S. Cl. .................. 331/111; 331/145; 331/177 R
[58] Field of Search ............ 331/111, 113 R, 144, 331/14 S, 153, 177 R, 177 V, 184

[56] References Cited

U.S. PATENT DOCUMENTS

| 3,364,441 | 1/1968 | Rogers | 331/111 |
| 3,843,938 | 10/1974 | Bergman | 331/111 |
| 3,924,202 | 12/1975 | Craft | 331/111 |

FOREIGN PATENT DOCUMENTS 57-109416  7/1982  Japan.
57-157624  9/1982  Japan.

OTHER PUBLICATIONS

E. Yoneda et al, "A Consideration on TV–Signal Transmission Using PFM Technique Over Optical Fiber Cables", Society of Electronic Communications, CS77-153, 1977.
Wickes, William E., Logic Design with Integrated Circuits, John Wiley & Sons, Inc., New York, 1968, p. 97.

*Primary Examiner*—Gene Wan
*Attorney, Agent, or Firm*—Schwartz, Jeffery, Schwaab, Mack, Blumenthal & Evans

[57] ABSTRACT

The voltage-controlled variable-frequency pulse oscillator in accordance with the present invention comprises an integrating capacitor, a variable current source for generating charging current for said integrating capacitor in response to the controlling voltage, a fixed current source for discharging said capacitor, a switching circuit for controlling the discharge of said capacitor, a comparator for outputting a discrimination signal by comparing the voltage of the capacitor and a reference voltage, and a multivibrator for receiving the discrimination signal from the comparator and for outputting a pulse signal with a frequency corresponding to the controlling voltage from the variable current source. The multivibrator comprises an R-S flip-flop for receiving the discrimination signal output by the comparator at its set side OR-NOR gates, and receiving and inverting the output of the reset side gate which is delayed by a prescribed time to the reset side OR-NOR gate. The R-S flip-flop is constructed to permit the oscillation output with a prescribed frequency to be taken out from the reset side OR-NOR gates, and the oscillation output of the R-S flip-flop controls the drive of the switching circuit. Therefore, the multivibrator starts oscillation on its own with a prescribed width when the capacitor voltage grows very large at the time of turning the power supply on or at the time of generation of an excessively large current where the output of the comparator continues to stay at a constant value. Furthermore, the current value of the fixed current source is set at more than twice the maximum current value of the variable current source. Because of this, the large voltage of the capacitor decreases gradually with ups and downs, and the comparator inverts after a certain time, the multivibrator discontinues the self oscillation, and the ordinary operation of the device takes place.

13 Claims, 21 Drawing Figures

VOLTAGE-CONTROLLED VARIABLE-FREQUENCY PULSE OSCILLATOR

BACKGROUND OF THE INVENTION

1. Field of the Invention

The present invention relates to a voltage-controlled variable-frequency pulse oscillator, and more particularly, to a pulse oscillator starts oscillation on its own when oscillation is interrupted due to turn on of the power supply or the like condition.

2. Description of the Prior Art

In recent times, voltage-controlled variable-frequency pulse oscillator of pulse feedback type is being utilized widely for various purposes. In a voltage-controlled variable-frequency pulse oscillator of this type, voltage of triangular wave form is generated by charging an integrating capacitor with a reference constant-current source and a voltage controllable current source, and then discharging the charged electricity through operation of a switching circuit which is connected to the capacitor. There are known oscillators of the kind in which the voltage thus generated is compared with a reference voltage by a comparator, and pulse signal with prescribed frequency is outputted by means of a monostable multivibrator.

The monostable multivibrator mentioned above is composed, for example, of an R-S flip-flop circuit obtained by connecting two OR-NOR gates in crisscross fashion. The OR output on the set side and the input on the reset side of the R-S flip-flop are connected via a delay circuit, and a voltage pulse is generated over the delay time of the delay circuit. The output terminals of the R-S flip-flop are connected to the switching circuit which is kept turned on for the duration of the pulse width of the voltage pulse. Discharge of the capacitor is carried out by the difference between the electric current of the reference constant-current source for discharge and the electric current of the current source for charging. Since the charging time of the capacitor varies according to the voltage control of the current source, the oscillator is constructed to have varying pulse frequency for the output of the R-S flip-flop in response to the controlling voltage of the voltage controllable current source.

However, when a rush current or an excessive noise current is generated in a voltage-controlled variable-frequency pulse oscillator due to turning the power supply or switch on, or like action, an unusually high voltage far exceeding the reference voltage, that is, the threshold voltage, for the comparator is charged to the capacitor, and is sent to the comparator. Accordingly, the inversion operation of the output of the comparator is suspended, allowing the capacitor to discharge for the period corresponding to the duration of just one pulse. Namely, a prior art pulse oscillartor of the above description gives rise to a problem that the repetition of discharge is discontinued at the time of throwing in the power supply or a switch, resulting in terminating the oscilation.

In order to resolve the above problem, a new oscillator has been proposed by the present applicant. This oscillator includes an R-S flip-flop in which a pair of OR-NOR gates are connected in the crisscross fashion where the output Q of the gate on the set input side is fed back, via delay circuit with prescribed delay time, to the reset input of the gate on the reset side.

To be more specific, this oscillator is disclosed in Japanese Patent-Publication No. 57-109416 which has already been filed by the applicant.

With an R-S flip-flop of the above construction, when both of the set input and the reset input are [1], the output Q becomes [1] while the output Q becomes [0]. In this case, even when the set input of the R-S flip-flop remains continuously at [1] due to suspension of oscillation, the output of the monostatic multivibrator stays at [1] also corresponding to the continuous valve [1] of the set input. Accordingly, discharge will be continued for some time until the voltage reaches the threshold value for the comparator when the output of the comparator is inverted, resuming the oscillation.

However, in a circuit construction like in the above, when the pulse width of the output signal from the comparator is larger than the ordinary width, ordinary oscillation is not possible because of an increase in the discharge time of the switching circuit.

That is, the width of the pulse from the comparator has to be smaller than the discharge time of the switching circuit in order to realize an ordinary oscillation. It is noted here, for making the oscillation frequency fs large, that it is necessary to choose the discharge time of the switching circuit to be smaller than the value determined by the general condition for sustaining oscillation. As explained in the foregoing, however, the pulse width of the comparator has to be smaller than the discharge time of the switching circuit so that there is a problem that the upper limit of the oscillation frequency need be restricted.

It should be mentioned further that there has been proposed the following as an alternative method for resolving the problem of discontinuation of oscillation. Namely, a method by which the capacitor is forced to discharge when an unusually high voltage exceeding the threshold of the comparator is applied to the capacitor at a time such as turning the power supply or a switch on. A pulse oscillator is formed by attaching a forced discharge circuit comprising a second comparator and a switching circuit for forcing the capacitor to discharge. The pulse oscillator discribed in the foregoing has been disclosed in Japanese Patent Disclosure No. 57-157624.

However, a pulse oscillator like the one described in the above requires an additional forced discharge circuit comprising a comparator and a switching circuit such that it was to lead to new problem like a complicated circuit construction, large size of the oscillator itself, increased cost for manufacturing the oscillator, and so forth.

SUMMARY OF THE INVENTION

An object of the present invention is to provide a small-sized voltage-controlled variable-frequency pulse oscillator which is capable of markedly relaxing the upper limit of the oscillation frequency as well as preventing the discontinuation of the oscillation due to turn-on of the power supply or an excessive noise current.

Another object of the present invention is to provide a voltage-controlled variable-frequency pulse oscillator which is capable of reducing the jitter of the oscillation pulse.

Still another object of the present invention is to provide a small-sized volume-controlled variable-frequency pulse oscillator capable of resuming the operation on its own when oscillation was discontinued due to turn-on of the power supply or an excessive noise current.

Briefly described, these and other objects of the present invention are accomplished by the provision of an improved voltage-controlled variable-frequency pulse oscillator which includes
- an integrating capacitor;
- a variable current source for supplying a charging current to the capacitor, which varies with a control voltage of the current source;
- a fixed current source for supplying a discharging current to the capacitor;
- a comparator for comparing the charge voltage of the capacitor with a reference voltage and for producing an output signal;
- monostable multivibrator means having first and second gate means, each having first and second input terminals and first and second output terminals, the first input terminal of the first gate means being connected to the output of the comparator, the second input of the first gate means being connected to the first output terminal of the second gate means, the second output terminal of the first gate means being connected to the first input terminal of the second gate means, the first output terminal of the second gate means being connected to the second input terminal of the second gate means through a delay circuit, an oscillation output signal with predetermined frequency being supplied from the first and second output terminals of the second gate means; and
- switching means connected between the integrating capacitor and the fixed current source for controlling the discharge of the capacitor in response to output signals from the second gate means of the multivibrator means.

The electric current of the fixed current source is set to be more than twice the maximum current of the variable current source.

BRIEF DESCRIPTION OF THE DRAWING

These and other objects, features, and advantages of the present invention will be more apparent from the following description of a preferred embodiment taken in conjunction with the accompanying drawings, in which.

DESCRIPTION OF THE PREFERRED EMBODIMENTS

To facilitate the understanding of the present invention a brief reference will be made to prior art voltage-controlled variable-frequency pulse oscillator illustrated in FIGS. 1 to 6.

Figure 1:
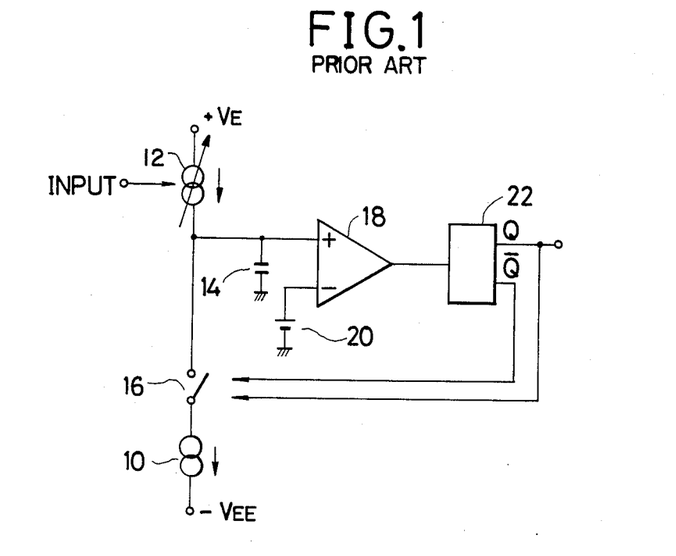
FIG. 1 is a circuit diagram illustrating the overall construction of a prior art voltage-controlled variable-frequency pulse oscillator.

As shown in FIG. 1, a voltage-controlled variable-frequency pulse oscillator of general type uses a reference constant current source 10 and a voltage controllable current source 12 for charging an integrating capacitor 14, and a voltage of triangular wave form is generated by discharging the charge on the capacitor 14 by the operation of a switching circuit 16 which is connected to the capacitor 14. The voltage thus generated is compared by a comparator 18 with the reference voltage 20 to transmit a pulse signal with prescribed frequency by means of a monostable multi-vibrator 22.

Figure 2:
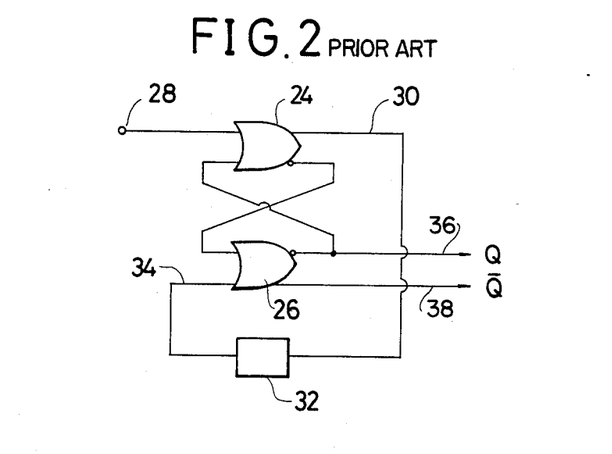
FIG. 2 is a circuit diagram for a monostable multivibrator of the pulse oscillator shown in FIG. 1.

In FIG. 2, the concrete circuit construction of the monostable multivibrator 22 is illustrated. It is constructed to form an R-S flip-flop circuit by connecting a couple of OR-NOR gates 24 and 26 in the so-called crisscross fashion. In this R-S flip-flop circuit, when the input 28 becomes [1], then via the OR output 30 of the OR-NOR gate 24 on the set side, and the delay circuit 32, the reset input 34 becomes [1] which causes the outputs Q 36 and $\overline{Q}$ 38 to becomes [1] and [0], respectively, and generates a voltage pulse for the duration of delay time of the delay circuit 32. Further, the switching circuit 16 is maintained in the on state by the voltage pulse for the duration of the width of the pulse, and the discharge of the capacitor 14 is carried out by the difference between the electric current of the reference constant-current source 10 for discharge and the electric current of the current source 12 for charging. The charging time of the capacitor 14 varies with the voltage control of the current source 12. Accordingly, the pulse frequency of the outputs Q 36 and $\overline{Q}$ 38 varies corresponding to the variations in the controlling voltage of the current source 12. The variation of the voltage between the two plates of the capacitor 14 is represented by charging and discharging over prescribed times $\tau_1$ and $\tau_2$, respectively, with the threshold value 40 of the comparator as the reference. This voltage is outputted from the comparator 18 in the form as shown in FIG. 3b, and is inputted to the set input 28 of the R-S flip-flop circuit, shown in FIG. 2, of the monostable multivibrator 22. As a result, the output 36 of the R-S flip-flop circuit is given, as shown in FIG. 3C, a pulse width $t_d$ corresponding to the delay time of the delay circuit 32. The capacitor 14 discharges for a period of $t_d$ as shown in FIG. 3a.

Figure 3:
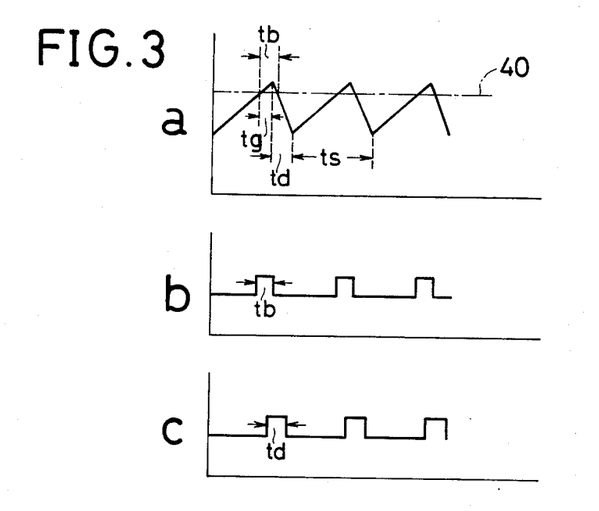
FIGS. 3a to 3c are time charts illustrating the operation of the pulse oscillator shown in FIG. 1.
Figure 4:
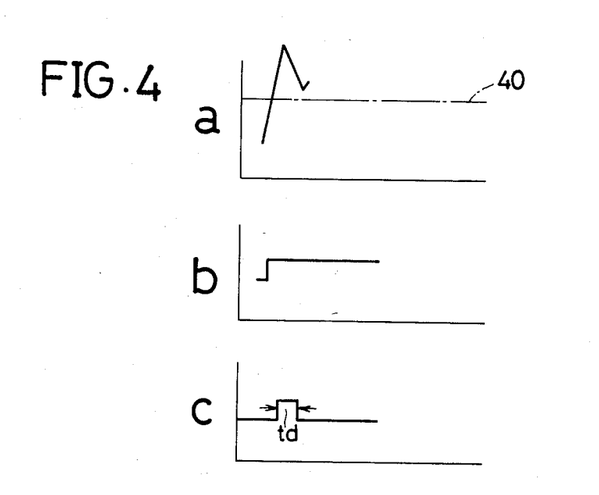
FIGS. 4a to 4c are time charts illustrating the operation of the pulse oscillator shown in FIG. 1 at the time of turning the power supply on or at the time of generation of an excessive noise current.

Next, the relationship between the current source 12 and the oscillation frequency fs will be explained in more detail. Here, the electric current of the voltage controllable current source 12 is given by is=kVs, the electric current of the reference constant-current source 10 for discharge by id, the capacity of the capacitor 14 by C, and further, as shown in FIG 3, the discharge time of the capacitor 14 by td, and the period of the charge and discharge cycle by ts. Then, since the electricity charged in the period of $t_s - t_d$ is discharged in the period of $t_d$, as is clear from FIG. 3a, the following relation holds.

$$\frac{i_s}{C}(t_s - t_d) = \frac{i_d - i_s}{C} t_d \qquad (1)$$

Therefore, there is obtained $$f_s = (i_s)/(i_d t_d) = (kv_s)/(i_d t_d) \qquad (2)$$

That is to say, as $i_d$ remains constant, if the discharge time $t_d$ of the capacitor 14 which is determined by the delay circuit 32 is constant, the oscillation frequency fs varies in response to the input voltage Vs to the current source 12. What was explained in the foregoing summarized the construction and the theory of operation of the voltage-controlled variable-frequency pulse oscillator shown in FIG. 1. When the capacitor 14 is charged by turning the power supply on or by an excessive noise current, the voltage between the plates of the capacitor 14 markedly exceeds the threshold value 40 of the comparator 18, and the output of the comparator 18 as shown by FIG. 4b is inputted to the monostatic multivibrator 22 which gives rise in turn to an output with the pulse width $t_d$ as shown in FIG. 4C. In this case, however, inversion of the output of the comparator 18 fails to take place, as shown in FIG. 4b, and accordingly, there occurs discharge of the capacitor 14 for a period corresponding to the width of one pulse alone. This results in the discontinuation of charging of the capacitor 14 and hence to the discontinuation of oscillation.

Figure 5:
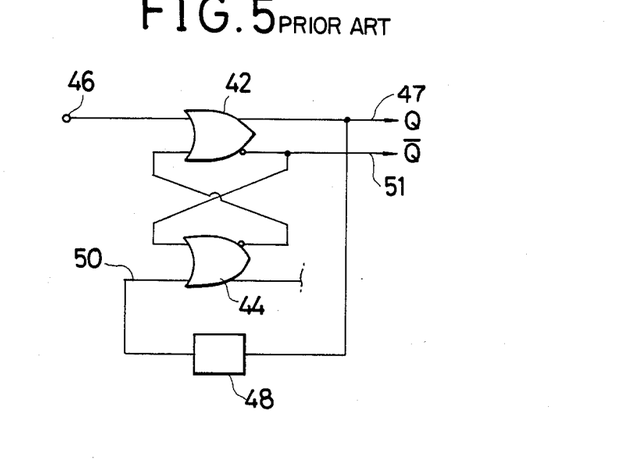
FIG. 5 is a circuit diagram for a monostable multi vibrator of another example of prior art voltage-controlled variable-frequency pulse oscillator.
Figure 6:
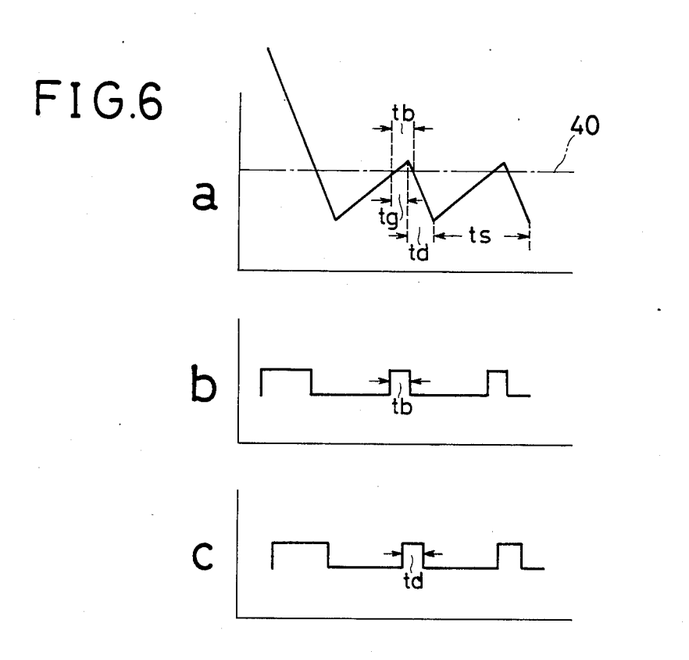
FIGS. 6a to 6c are time charts illustrating the operation of the pulse oscillator shwon in FIG. 5 at the time of turning the power supply on or at the time of generation of an excessive noise current.

In order to avoid the discontinuation of oscillation caused by abnormal charging of the capacitor 14 due to turning on of the power supply or by an excessive noise current, there has been known an oscillator of the construction as shown by FIG. 1 in which the R-S flip-flop circuit is replaced by the one as shown in FIG. 5. It is equivalent to the oscillator which has been disclosed in Japanese Patent Disclosure No. 57-109416 filed by the present applicant. Namely, an R-S flip-flop circuit is constructed by connecting a pair of OR-NOR gates 42 and 44 in crisscross fashion, and the output Q 47 of the gate 42 on the side of the reset input 46 is fed back to the reset input 50 of the gate 44 via the delay circuit 48 with prescribed delay time. With such a circuit construction, when both of the set input 46 and the reset input 50 are [1], the output Q 47 becomes [1] while the output $\overline{Q}$ 51 becomes [0]. In this case, even if the state of discontinuation of oscillation occurs as described in the above to have the output of the comparator 18 as shown in FIG. 1, namely, the set input 46 to the R-S flip-flop circuit becomes continuously [1] the output of the monostable multivibrator becomes also [1] corresponding to the continuation of [1] for the set input 46. Accordingly, discharge continues further until inversion of the output of the comparator 18, and oscillation takes place.

Namely, when the voltage of the capacitor 14 is abnormally high as shown in FIGS. 6a and 6b, it takes a longer time than usual before the voltage becomes lower than the threshold value 40 of the comparator 18. However, in the circuit construction shown in FIG. 5, it is so arranged as to increase the discharge time of the capacitor 14, as shown in FIG. 6c, according to the increase of the input time of [1] to the set input 46 as in FIG. 6b. As a result, the output of the comparator 18 eventually is inverted, which causes the oscillation to initiate. However, in the case of circuit construction as shown FIG. 5, if the pulse width of the output of the comparator 18, shown in FIG. 6b, is larger than the ordinary value for $t_b$, the discharge time of the switching circuit 16 shown in FIG. 6c has to be increased accordingly, preventing the ordinary oscillation from taking place. That is, in order to realize and ordinary oscillation the following relation has to be satisfied.

$$t_b < t_d \qquad (3)$$

Here, the general condition for oscillation will be given. Namely, the time $t_s - t_b$ at which the voltage of the capacitor 14 becomes less than the threshold value 40 of the comparator 18 is given by the following equation.

$$t_s - t_b = 1/f_s = t_g/1 - t_d f_s \qquad (4)$$

Accordingly, $t_b$ is given by $$t_b = t_g/1 - t_d f_s \qquad (5)$$

In this case, $t_d$ has to remain constant as mentioned earlier and tg is the time when the voltage of the capacitor 14 exceeds the threshold 40 of the comparator until the switching circuit 16 is closed so that when fs is made large by increasing the input voltage to the current source 12, it is not possilbe, as is clear from Eq. (5), to sustain oscillation unless $t_d$ is made small. Accordingly, in a circuit construction shown in FIG. 5 which is subject to a restriction like Eq. (3), there exists a disadvantage that the upper limit of the oscillation frequency fs will have to be lowered to a large extent.

A voltage-controlled variable-frequency pulse oscillator according to the present invention is provided for resolving these problems in the prior art system, and the embodiments of the invention will be described by referring to FIGS. 7 to 12.

Figure 7:
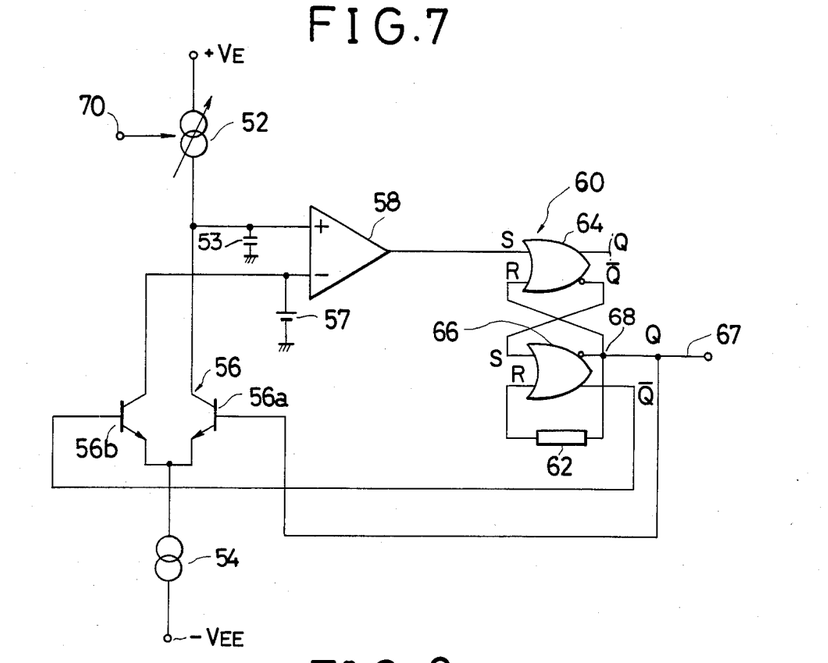
FIG. 7 is the circuit diagram illustrating the overall contruction of a voltage-controlled variable-frequency pulse oscillator embodying the present invention.

As shown, the voltage-controlled variable-frequency pulse oscillator in accordance with the present invention includes an integrating capacitor 53, a variable current source 52 for variably setting the charging current to the capacitor 53 in response to the controlling voltage, a fixed current source 54 for discharging the capacitor 53, a switching circuit 56 for controlling the discharge, a comparator 58 for outputting a discrimination signal by comparing the voltage of the capacitor 53 and the reference voltage 57, and a monostatic multivibrator 60 for providing an oscillating, pulsed signal with prescribed frequency by receiving the discrimination signal. In this case, the charge and discharge are defined by supplying an electrical charge to one electrode of the capacitor.

The above monostatic multivibrator 60 includes an R-S flip-flop which excutes the inversion operation by inputting the discrimination signal from the comparator 58 to the set terminal, and inputting its Q output to the reset terminal via a delay circuit with prescribed delay time. The R-S flip flop circuit 60 includes the OR-NOR gates 64 on the set side and the OR-NOR gates 66 on the reset side, with a construction which permits one to take out the output 67 of the R-S flip-flop circuit from the NOR terminal 68 of the reset-side gates 66. Furthermore, it is so constructed as to have the electric current of the fixed current source 54 to be larger than twice the maximum electric current of the variable current source 52.

Next, operation of a voltage-controlled variable-frequency pulse oscillator with the construction like in the above will be illustrated.

The electric current of the variable current source 52 changes with the voltage at the input 70 so that the charging current to the capacitor 53 can be varied. When the capacitor 53 is charged up to the voltage of the constant current source 54, the output of the comparator 58 becomes [1] which is then inputted to the monostable multivibrator 60 comprising the OR-NOR gates 64 and 66 and a delay circuit 62.

Figure 8:
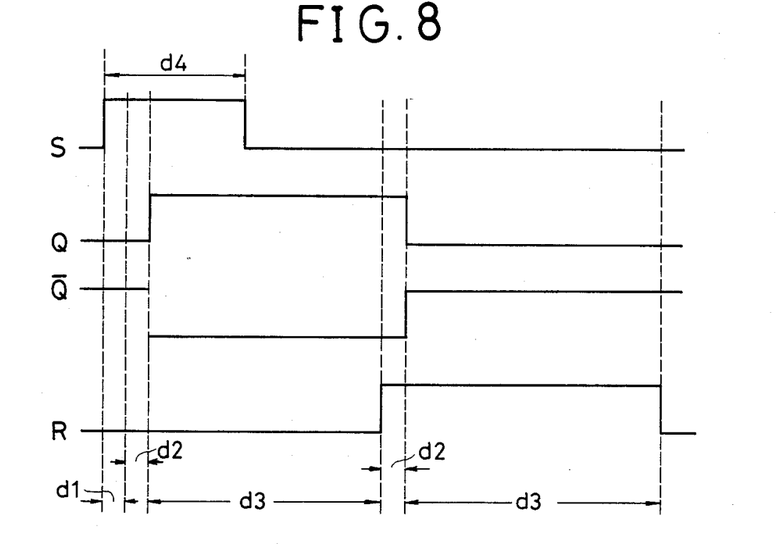
FIG. 8 is a time chart illustrating the operation of the monostatic multivibrator of the pulse oscillator shown in FIG. 7.

As shown in the timing chart of the monostable multivibrator, in FIG. 8, at a time $d_1+d_2$, when $d_1$ is the propagation delay of the OR-NOR gate 64 on the set side and $d_2$ is the propagation delay of the OR-NOR gate 66 on the reset side after the set input became [1], the Q output becomes [1] and the $\overline{Q}$ output becomes [0]. Then the reset terminal is activated via the delay circuit 62 with delay time $d_3$, and after a time of $d_3+d_2$ the Q output becomes [0] while the $\overline{Q}$ output becomes [1]. Accordingly, the switch of the differential switching circuit 56 is kept in the on state for a period of $d_3+d_2$, allowing a discharge of the capacitor 53 with constant current. In this case, the discharge current of the capacitor 53 is determined by the difference between the collector current of the transistor 56a and the current of the variable current source 52. The capacitor 53 discharges for the duration corresponding to the pulse width of the output. Then, charging starts with the [0] value of the output of Q. In this way, in the ordinary operation of the oscillator, the pulse frequency of the output can be varied by the voltage of the input 70. Here, the pulse width of the output is determined by $d_3+d_2$ in terms of the delay time $d_3$ of the delay circuit and the propagation delay $d_2$ of the OR-NOR gates 66 on the reset side. It should be noted that the temperature variations of the width $d_3+d_2$ of the output pulse are small since the propagation delay $d_2$ of the OR-NOR gates is small and its temperature variations are small also. Moreover, the temperature variations of the threshold value cancel each other, and hence are small, due to the differential nature of the switch for discharge control of the capacitor 53. Therefore, the temperature variations of the time required for the comparator 53 to become [1] are small. This has an effect for suppressing the jitter of the pulse oscillator.

Figure 9:
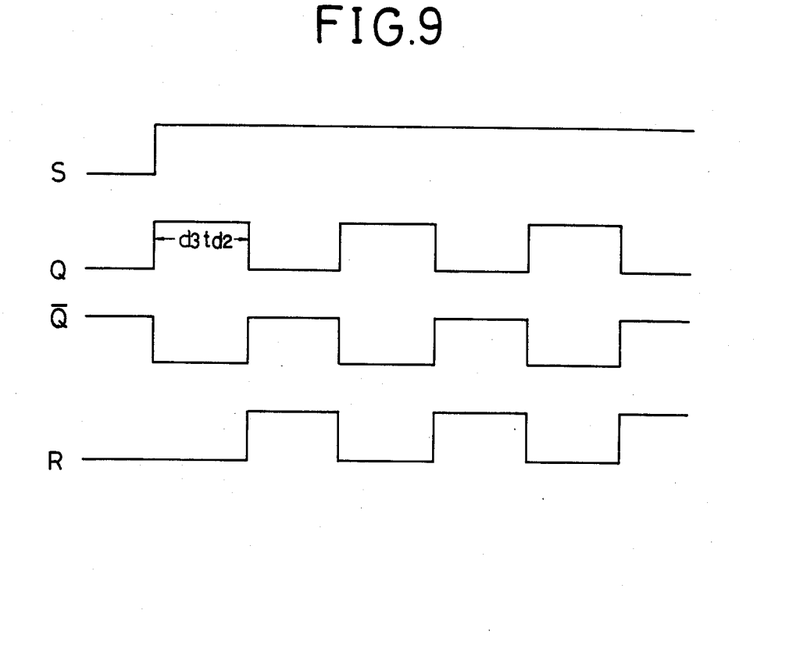
FIG. 9 is a time chart illustrating the operation of the monostatic multivibrator of the pulse oscillator shown in FIG. 7 at the time of turning the power supply on or at time of generation of an excessive noise current.
Figure 10:
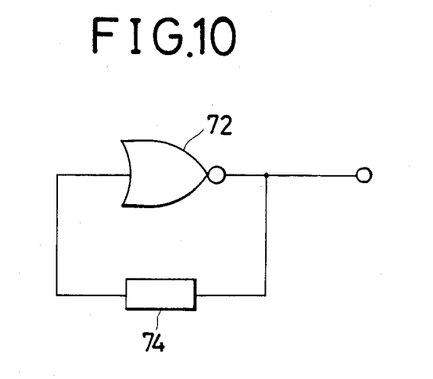
FIG. 10 is a equivalent circuit diagram for the monostatic multivibrator of the pulse oscillator shown in FIG. 7 at the time of turning the power supply on or at the time of generation of an excessive noise current.

Next, consider what happens to the case of turning the power supply on or overcharging the capacitor 53 with an excessive noise current. In such a case, the potential of the capacitor 53 fails to attain, by discharge, a value which is less than the reference potential 57 within the time corresponding to the width of the output pulse of the output 67 of the monostatic multivibrator. Therefore, there arises a state in which the output of the comparator 58 continues to stay at [1]. The timing chart for this situation is illustrated in FIG. 9. In the figure, the propagation delays of the gates are left out of the consideration. As shown, the output pulse continues to oscillate with a prescribed pulse width $(d_3+d_2)$. The state of the monostable multivibrator corresponding to this situation is illustrated in FIG. 10. It will be seen that it is operating as a bistatic multivibrator constructed from an inverter 72 and a delay circuit 74.

Figure 11:
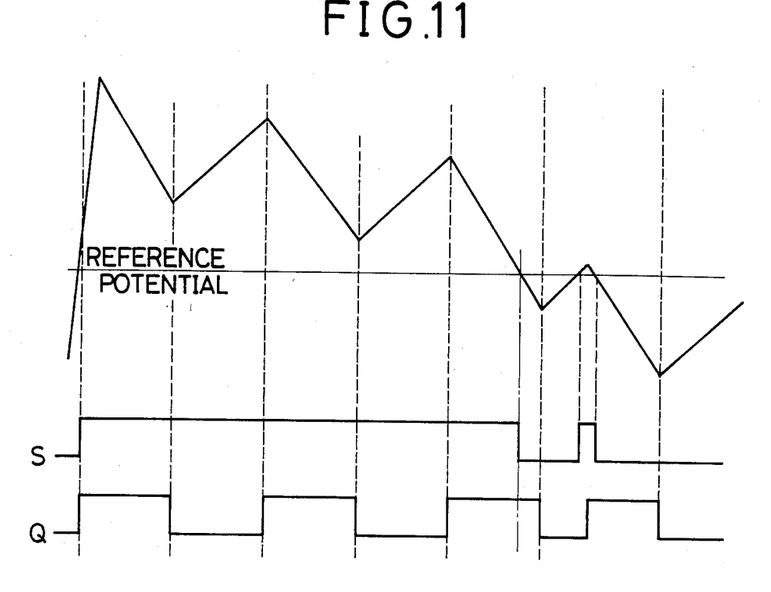
FIG. 11 is a time chart illustrating the operation of the pulse oscillator shown in FIG. 7 at the time of turning the power supply on or at the time of generation of an excessive noise current.

If the maximum value of the collector current of the variable current source 52 for charging is called $i_{cmax}$ and the collector current of the current source 54 for discharging is called $i_{c2}$, the charging current is represented by $i_{cmax}$ while the charging current is represented by $i_{c2}-i_{cmax}$. If the charging current is chosen to satisfy $i_{c2}-i_{cmax}>i_{cmax}$, or $i_{c2}>2i_{cmax}$, the potential of the capacitor decreases gradually with ups and downs, the comparator inverts at a certain time to output [0], as shown in FIG. 11, and the self oscillation stops and an ordinary operation begins. In the figure, there is shown the output Q of the monostatic multivibrator 60 where [1] for Q represents discharge.

In this manner, if oscillation discontinues due to turning on of the power supply or an excessive noise current, the multivibrator self-oscillates and resumes the ordinary oscillation.

In this case, by constructing the multivibrator as shown in FIG. 7, the condition for having an ordinary oscillation is given, in terms of the pulse width $d_4$ of the set input and the pulse width $d_3+d_2$ of the Q output shown in FIG. 8, by $$d_4<2(d_3+d_2) \tag{6}$$

Here, by replacing Eq. (6) by a relation between $t_b$ and $t_d$ similar to Eq. (3) there is obtained $$t_b<2t_d \tag{7}$$

That is, since $t_d$ needs only to satisfy the relation in Eq. (7), with the help of Eq. (5) it is seen that the restriction on frequency will be relaxed to a large extent from the relation $t_p<t_d$ which has been used hitherto.

It should be mentioned that, though bipolar transistors have been used for the switching circuit in the present embodiment, the switching circuit may also be constructed ultilizing J-FETs, MOS-FETs, and the like.

Figure 12:
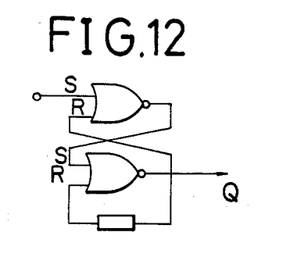
FIGS. 12 to 15 are circuit diagrams for another embodiment of the voltage-controlled variable-frequency pulse oscillator in accordance with the present invention.

Furthermore, though the switch for discharge control in the present embodiment has been constructed by the use of differential bipolar transistor, the operation of this section can also accomplished with a system other than the differential system. In that case, the monostatic multivibrator section may be constructed by the use of two NOR gates as shown in FIG. 12.

Figure 13:
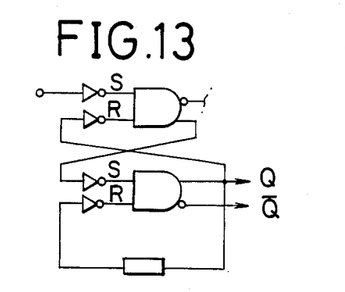
Figure 14:
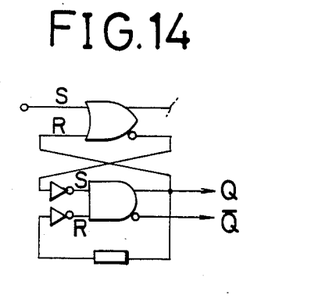
Figure 15:
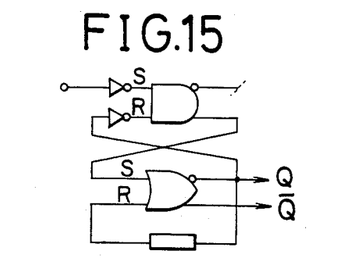

Similarly, the monostable multivibrator may be constructed either by using two AND-UAND gates with inverters on the input side, as shown in FIG. 13, or by using OR-NOR gates as the set side gates and AND-HAND gates with inverters on the input side as the reset side gates, as shown in FIG. 14, or still otherwise, by using AND-HAND gates with inverters on the input side as the set side gates and OR-NOR gates as the reset side gates, as shown in FIG. 15. Further, the AND-HAND gates on the set side in FIG. 13 may be replaced by AND gates, and the set side gates in FIGS. 14 and 15 may be replaced by NOR gates and AND gates, respectively.

Various modifications will become possible for those skilled in the art after receiving the teachings of the present disclosure without departing from the scope thereof.

What is claimed is:

1. A voltage-controlled variable-frequency pulse oscillator comprising:
    an integrating capacitor;
    a variable current source for supplying a charging current to said capacitor, which varies with a control voltage of said current source;
    a fixed current source for supplying a discharging current to said capacitor;
    a comparator for comparing said charge voltage of said capacitor with a reference voltage and for producing an output signal;
    monostable multivibrator means having first and second gate means, said first gate means having first and second input terminals and an output terminal, said second gate means having first and second input terminals and first and second output terminals, the first input terminal of said first gate means being connected to the output of said comparator, the second input of said first gate means being connected to the first output terminal of the second gate means, the output terminal of said first gate means being connected to the first input terminal of said second gate means, the first output terminal of said second gate means being connected to the second input terminal of said second gate means through a delay circuit, an oscillation output signal with predetermined frequency being supplied from the first and second output terminals of said second gate means; and
    switching means connected between said integrating capacitor and said fixed current source for controlling the discharge of said capacitor in response to output signals from said second gate means of said multivibrator means.

2. A voltage-controlled variable-frequency pulse oscillator as claimed in claim 1, wherein said switching means comprises first and second transistors, the base of the first transistor is connected to the first output terminal of said second gate means, the emitter thereof is connected to said fixed current source, and the collector thereof is connected both to said variable current source and one terminal of said comparator, while the base of the second transistor is connected to the second output terminal of said second gate means, the emitter thereof is connected to the fixed current source, and the collector thereof is connected to a second terminal of said comparator.

3. A voltage-controlled variable-frequency pulse oscillator as claimed in claim 1 or claim 2, wherein the discharging time of the capacitor is determined by the current difference between the collector currents of the first and second transistors of the switching means.

4. A voltage-controlled variable-frequency pulse oscillator as claimed in claim 1 or claim 2, wherein the operation time of said switching means is determined by control signals produced from the second gate means and affected by the time delay of said delay circuit plus the time delay in the operation of the second gate means, whereby the discharge of the capacitor is carried out by the current from the fixed current source.

5. A voltage-controlled variable-frequency pulse oscillator as claimed in claim 1 or claim 2, wherein the current value of said fixed current source is set at more than twice the maximum current value of said variable current source.

6. A voltage-controlled variable-frequency pulse oscillator as claimed in claim 3, wherein the current value of said fixed current source is set at more than twice the maximum current value of said variable current source.

7. A voltage-controlled variable-frequency pulse oscillator as claimed in claim 4, wherein the current value of said fixed current source is set at more than twice the maximum current value of said variable current source.

8. A voltage-controlled variable-frequency pulse oscillator as claimed in claim 1, wherein the first and second gate means are OR-NOR gates.

9. A voltage-controlled variable-frequency pulse oscillator as claimed in claim 1, in which the first and second gate means are AND-NAND gates with inverters on their respective input sides.

10. A voltage-controlled variable-frequency pulse oscillator as claimed in claim 1, in which the first gate means is an OR-NOR gate, and the second gate means is an AND-NAND gate with inverters on its input side.

11. A voltage-controlled variable-frequency pulse oscillator as claimed in claim 1, in which the first gate means is an AND-NAND gate with inverters on its input side and the second gate means is an OR-NOR gate.

12. A voltage-controlled variable-frequency pulse oscillator comprising:
    an integrating capacitor;
    a variable current source for supplying a charging current to said capacitor, said charging current variable in response to a control voltage of said current source;
    a fixed current source for supplying a discharging current to said capacitor;
    a comparator for comparing said charge voltage of said capacitor with a reference voltage and for producing an output signal;
    monostable multivibrator means having first and second gate means, each having first and second input terminals and an output terminal, the first input terminal of said first gate means being connected to the output of said comparator, the second input of said first gate means being connected to the second input terminal of said second gate means through a delay circuit, the output of said first gate means connected to the first input terminal of said second gate means, an oscillation output signal with predetermined frequency being supplied from the output terminal of the second gate means; and
    switching means connected between said integrating capacitor and said fixed current source for controlling the discharge of said capacitor in response to an output signal from said second gate means.

13. A voltage-controlled variable-frequency pulse oscillator as claimed in claim 12, in which the first and second gate means are NOR gates.

* * * * *

UNITED STATES PATENT AND TRADEMARK OFFICE
CERTIFICATE OF CORRECTION

PATENT NO. : 4,644,300
DATED : February 17, 1987
INVENTOR(S) : Hiroyuki IBE, et al.

It is certified that error appears in the above—identified patent and that said Letters Patent is hereby corrected as shown below:

Column 6, line 29, equation (4) should read:

$$-- t_s - t_b = \frac{1}{f_s} - \frac{t_g}{1-t_d f_s} --$$

Signed and Sealed this

Nineteenth Day of April, 1988

Attest:

DONALD J. QUIGG

*Attesting Officer*   *Commissioner of Patents and Trademarks*